United States Patent
Hellwig

(10) Patent No.: US 7,023,760 B2
(45) Date of Patent: Apr. 4, 2006

(54) MEMORY ARRANGEMENT FOR PROCESSING DATA, AND METHOD

(75) Inventor: Frank Hellwig, Munich (DE)

(73) Assignee: Infineon Technologies AG, Munich (DE)

( * ) Notice: Subject to any disclaimer, the term of this patent is extended or adjusted under 35 U.S.C. 154(b) by 55 days.

(21) Appl. No.: 10/878,172

(22) Filed: Jun. 28, 2004

(65) Prior Publication Data

US 2005/0018528 A1    Jan. 27, 2005

(30) Foreign Application Priority Data

Jul. 23, 2003    (DE) .................... 103 33 522

(51) Int. Cl.
*G11C 8/00*    (2006.01)

(52) U.S. Cl. ................. 365/233; 365/194; 365/189.12; 365/191

(58) Field of Classification Search ................ 365/233, 365/194, 191, 189.12

See application file for complete search history.

(56) References Cited

U.S. PATENT DOCUMENTS

| 6,094,380 A | * | 7/2000 | Kim .......................... 365/194 |
| 6,414,891 B1 | * | 7/2002 | Kuge et al. ................. 365/205 |
| 6,608,743 B1 | | 8/2003 | Suzuki |

FOREIGN PATENT DOCUMENTS

JP    2001 118 385 A    4/2001

OTHER PUBLICATIONS

Tran, "Synthesizable DDR SDRAM Controller", Xilinx: XAPP200 Application Note (V2.4), Jul. 18, 2002.

* cited by examiner

*Primary Examiner*—Connie C. Yoha
(74) *Attorney, Agent, or Firm*—Jenkins, Wilson, Taylor & Hunt, P.A.

(57) ABSTRACT

The invention relates to a memory arrangement for processing data and to a method for operating this memory arrangement. The inventive method involves a control signal being transferred together with the data on, with a change in the control signal activating the DLL circuit and synchronizing it to a clock. In this case, the DLL circuit stipulates a sampling time for the data. In line with the invention, after a predetermined length of time within which no data have been read from the memory, the memory is accessed artificially in order to generate a change in the control signal for the DLL circuit.

20 Claims, 1 Drawing Sheet

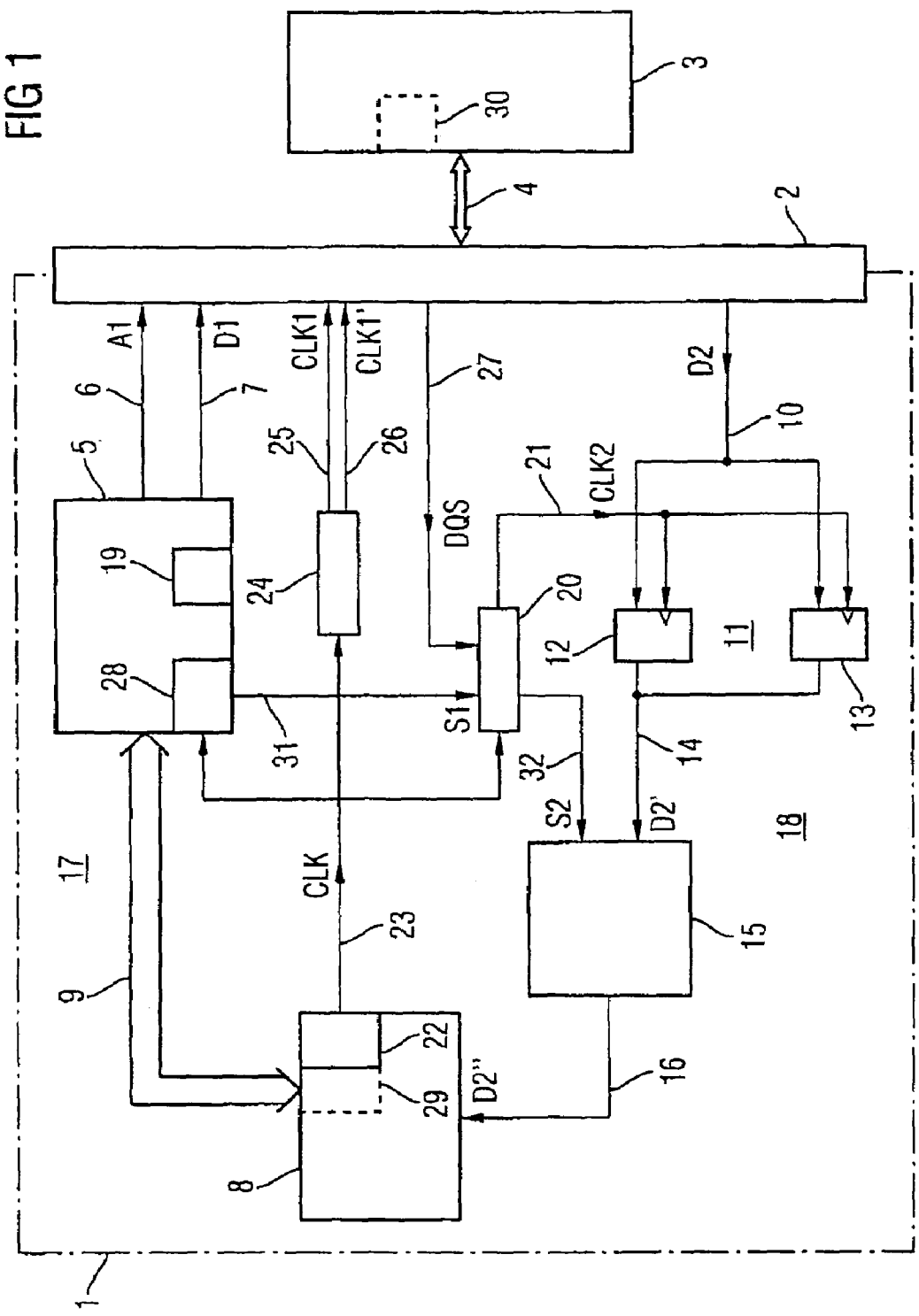

MEMORY ARRANGEMENT FOR PROCESSING DATA, AND METHOD

TECHNICAL FIELD

The invention relates to a memory arrangement for processing data which has a DLL circuit. The invention also relates to a method for operating this memory arrangement.

BACKGROUND ART

A DLL (Delay Locked Loop) circuit, frequently also referred to as a phase tracking loop, is used in general to maintain a defined delay for two correlated signals. Such a DLL circuit is described in US patent specification U.S. Pat. No. 6,043,694, for example.

The ever higher demands on reliability, smaller dimensions, lower power requirement, higher processing speed and lower price for integrated circuits result in ever larger scales of integration and in the development of large scale and very large scale integrated circuits. In the course of this development, complete systems are increasingly also being produced on one chip, these being known as SOC (System On Chip) systems. Such SOC systems were intended to be used for widely differing applications so that the development complexity is kept within acceptable limits and the system can still be produced in sufficiently large numbers and hence at optimized cost. For reasons of flexibility, the chip in modern SOC architectures therefore holds only those functional units which are necessary for the different applications. The other application specific functional units can be coupled on externally using an interface as required.

Thus, modern SOC architectures use external memory chips if greater memory resources are required for the respective application than are available in the respective SOC system. These external memory chips are coupled to the SOC system via an interface and can have information read from and written to them using an interface controller which is part of the SOC system.

Such memory chips may be in the form of DDR-SDRAM (DDR=Double Data Rate; SDRAM=Synchronous Dynamic Read Access Memory) memories, for example. In contrast to conventional SDR-SDRAM (SDR=Single Data Rate) memories, the data in DDR memories are transferred not only on the rising edge but also on the falling edge of the system clock. A DDR-SDRAM memory can thus be used to transfer data at a higher frequency, that is to say that a DDR-SDRAM memory effectively operates at 200 MHz for a 100 MHz bus clock, and the transfer rate increases from, for example, 0.8 to 1.6 Gbit/s as compared with conventional SDR-SDRAM memories. The actual memory cells in DDR-SDRAM memories operate no more quickly than conventional SDR-SDRAM memories, but they are addressed in pairs and are then read in succession, which means that effectively double the data transfer rate is made possible. DDR memories thus transfer two data words in each clock cycle. This principle has been known for a long time and is used in many processors, which means that the design and operation of such memories will not be discussed in more detail below.

So that transfer of the second data word in each clock step proceeds really precisely, DDR-SDRAM memories contain an internal clock synchronization circuit, which is typically in the form of a DLL circuit. This DLL circuit produces a defined signal delay for signals to or from the externally coupled memory. So that the exact synchronism between the data signals and the clock signal is maintained during the data transfer too, a differential clock signal is used. In addition, a bidirectional clocking system is used.

Present memory technologies, such as the DDR-SDRAM memory, involve the memory chip transferring DQS signals or DQS signal changes together with the data which have been read, said DQS signals or DQS signal changes indicating that a valid data item is being applied to the bus interface and can be read therefrom. These DQS signals are transferred simultaneously with the data which are to be read. This DQS signal is used to read the data item which is to be read in clocked fashion via the bus interface.

The asynchronous character of this data item which is to be read and of the associated DQS signals means that either the clocked data item which has been read on the memory interface needs to be synchronized to the system clock associated with the SOC system or the choice of low frequencies and environment parameters which are stable over wide ranges is able to guarantee that the data item which has been read arrives at the bus interface in sync and, in the process, as little infringement of the setup time and hold time with the system clock is registered as possible. In the first case, the bandwidth for the external memory chip would be reduced by the additional synchronization stages which are required as a result. In the second case, there is a reduction in bandwidth on account of the lower maximum frequency at which the external memory chip is operated. For both cases, there is thus a lower maximum frequency and hence a lower data transfer rate. Another drawback is that a stable ambient temperature, to which the SOC system and the memory coupled thereto are exposed, are not always guaranteed.

A third option is to choose the sampling time for the data which are to be read such that it always takes place in sync with the system clock. This sampling time is obtained from the DQS signals. The sampling time obtained through the DQS signal is shifted backward in time using the DLL circuit as soon as it is too close in time to the positive clock edge of the system clock, and a "setup time" infringement could arise as a result. In this context, it is also shifted backward in time equally to such an extent that no "hold time" infringement may arise either. This can be realized by a DLL circuit which is controlled by means of the DQS signal and the system clock. These hold time and setup time periods define a "prohibited zone" in which the sampling time must not be placed, since data losses may then arise when data are being read.

Since, in this situation, the DLL circuit is controlled using signal changes in the DQS signal from the memory chip, it is necessary to ensure that this DQS signal actually changes regularly, so that the sampling time stipulated by the DQS signal can be matched to alterations in the environment parameters (for example in the temperature or in the voltage). If the DQS signals do not change over a relatively long period, then the DLL circuit and hence also the sampling time are not matched to a propagation time which has changed. Such a change in the propagation time may arise, by way of example, on account of an alteration in the voltage or in the temperature, for example in the interface controller, on the bus interface, in the memory chip etc. This propagation time change may result in a shift in the sampling time relative to the clock, however, with the consequence that the sampling time is now situated in the "prohibited time range". If the external memory is then accessed after a relatively long time and the present setting of the DLL circuit no longer matches the propagation time for the signals from the memory chip to the interface controller, this can result in data losses.

SUMMARY OF THE INVENTION

The present invention is therefore based on the object of specifying a memory arrangement of the generic type in which certain data transfer is guaranteed even with unstable environment parameters. The intention is also to specify a method for operating such a memory arrangement.

The invention achieves the object for the arrangement by means of a memory arrangement having the features of patent claim 1. The object for the method is achieved by a method having the features of patent claim 12. Accordingly, the following are provided:

A memory arrangement for processing data, having an external memory, for writing and reading data, having an interface which is coupled to the memory and, during an access operation, has data applied to it together with a control signal indicating that valid data are being applied to the interface, having a register device whose data input is connected to the interface for the purpose of inputting the data applied thereto and which has a clock input for inputting a delayed clock signal, having a DLL circuit which has a control input for inputting the control signal, with a change in the control signal activating the DLL circuit, and which has a clock output for providing the delayed clock signal CLK2 which stipulates the sampling time in the register device and which synchronizes the register device, and having a device which effects forced access to the memory after a predetermined length of time within which there has been no access to the memory (patent claim 1).

A method for reading data from and/or for writing data to a memory, particularly in a memory arrangement according to one of the preceding claims, in which a control signal is also transferred together with the data, in which a change in the control signal activates the DLL circuit and synchronizes it to a clock, in which the DLL circuit stipulates a sampling time for the data, and in which, after a predetermined length of time within which no data have been read from the memory, the memory is accessed artificially in order to generate a change in the control signal for the DLL circuit (patent claim 13).

The idea on which the present invention is based is to generate an artificial access operation to an external memory in order to produce a change in the DQS signal as a result. For this purpose, the DLL circuit is stimulated on a regular basis, even when no access to an external memory has taken place over a relatively long period. This advantageously prevents the synchronism between the DLL circuit and the external DDR memory from being lost among changing operating conditions in the course of operation.

The insight on which the present invention is based is, in particular, that synchronism between the DLL circuit and the clock signal is no longer ensured when no access takes place, and hence no change in the DQS signal either, over a relatively long period. This is particularly relevant for applications in which the ambient temperatures are subject to severe fluctuations. If no resynchronization of the DLL circuit were to take place in this case, then it would be possible for the sampling time in the case of a fresh memory access operation to be in a prohibited range, for example close to a hold time or to a setup time. In this case, data could be lost in the extreme case. The inventive method and the inventive circuit arrangement can be used to prevent this by forcing an access operation artificially, i.e. externally, even if no data are currently intended to be read or written. The forced access operation changes the DQS signal, and the DLL circuit can be resynchronized. This ensures that the sampling time is always outside of this prohibited zone.

For this purpose, by way of example, a counter counts the clock cycles after the last access operation to the external memory. If the DDR memory is not reaccessed (resulting in a signal change for the DQS signal and hence tracking in the DLL circuit) within a particular period and hence after a corresponding number of clock cycles, then this DDR memory is accessed more or less "artificially". This access operation then results in a signal change for the DQS signal, and the DLL circuit into which the DQS signal is input is then resynchronized.

The particular number of clock cycles after which the memory is reacessed "artificially" may be firmly prescribed or else can be adjustable depending on the application.

The counter provided is typically a hardware counter which, by way of example, is part of the interface controller. In one advantageous refinement, a software version of the counter may also be provided. In this case, the software counter could be part of the computation device. In one particularly advantageous refinement, the counter may also be arranged in the DDR memory. In this case, the DDR memory may perform the access operation independently if no appropriate access operation has taken place by the time the fixed or set number of clock cycles has elapsed.

Particularly in the case of a DDR memory, the forced access operation is a read access operation which thus involves read data being read from the memory.

Advantageous refinements and developments of the invention are the subject matter of the further subclaims and also of the description with reference to the drawings.

BRIEF DESCRIPTION OF THE DRAWINGS

The invention is explained below using the exemplary embodiment in the single figure of the drawing. FIG. 1 shows a block diagram of a circuit arrangement based on the invention for processing data with an interface to an external memory chip and an adjustable DLL circuit.

DETAILED DESCRIPTION OF THE INVENTION

The inventive circuit arrangement has an SOC system denoted by reference symbol 1. The SOC system 1 is connected to a memory chip 3 by means of an external interface 2. It will be assumed that the memory chip 3 in FIG. 1 is in the form of a DDR-SDRAM memory chip— referred to below as DDR memory for short. The DDR memory 3 is coupled to the memory interface 2 by means of an address and data bus 4 which can be operated bidirectionally. The interface 2 and the address/data bus 4 can thus be used to read data from the DDR memory 3 and to write data into appropriately addressed areas of the DDR memory 3 upon a corresponding request from the SOC system 1. This data communication between the SOC system 1 and the DDR memory 3 is controlled by means of an interface controller 5 which is held in the SOC system 1. The interface controller 5 is connected to the memory interface 2 by means of data/address lines 6, 7 which the interface controller 5 can use to apply data D1 and addresses A1 to the memory interface 2 unidirectionally. The data lines 7 can thus be used to write data D1 to the DDR memory 3, whereas the address lines 6 are used to address corresponding memory areas of the DDR memory 2.

Upon an appropriate request from the interface controller 5, it is also possible to read data D2 from the DDR memory 3.

The corresponding data which are intended to be written to the DDR memory 3 (write data) are typically provided by a computation device 8. In this case, the computation device 8 is coupled to the interface controller 5 by means of data and control lines 9 which can be operated bidirectionally. These data and control lines 9 are firstly used for data communication between the computation device 8 and the interface controller 5 and secondly also for control. In this case, the computation device 8 can control the interface controller 5, and vice versa. By way of example, the computation device 8 may contain a program controlled device, for example a microprocessor or microcontroller.

Following a request, data D2 may also be read from the DDR memory 3. These data are then first applied to the memory interface 2 via the address/data bus 4. Data lines 10 which can be operated unidirectionally are used to supply the data D2 which have been read (read data) to a register device 11 at first for the purpose of sampling these data D2. In the case of the DDR memory architecture, the register device 11 contains two data sampling registers 12, 13, whose data inputs are connected to the data lines 10. Data D2 to be read are stored alternately in a respective one of the data sampling registers 12, 13, since the inverted clock signal CLK2 is input into the clock input of the data sampling register 13. The control is effected using the clock cycle in a delayed clock signal CLK2 which is input into the clock input of the data sampling registers 12, 13. This is described in more detail below. The data sampling registers 12, 13 sample the data D2 which have been read, the data D2 sampled at double frequency having the half data length of 32 bits, for example.

The sampled data D2' are supplied at the output to a device 15 for data preprocessing via data lines 14. This device 15 may, by way of example, be in the form of a memory controller, in the form of a FIFO (First In First Out) memory, in the form of a buffer memory, in the form of a data bus, in the form of a cache memory etc. In this case, the data in the device 15 again have the double bit length of 64 bits, for example, since the data D2' provided at the output by the two data sampling registers 12, 13 are input into the device 15 at the same time. In comparison with the data sampling registers 12, 13, in this case the data are processed at the normal, single frequency, however. The data D2" preprocessed in this manner by the device 15 are supplied via data lines 16 to the computation device 8, which processes the data D2" which have been read further in a suitable fashion in line with a respective program.

The SOC system 1 in FIG. 1 thus has a write path 17 and a read path 18. The write path 17 can be used to write data D1 from the computation device 8 to the DDR memory 3 via the interface controller 5. In the case of the read path 18, data D2 are read from the DDR memory 3 via the interface 2 and are written to the computation device 8 via the register device 11 and the device 15. Both the write path 17 and the read path 18 are provided with the respective DLL circuit 19, 20. In the case of the write path 17, the DLL circuit 19 is part of the interface controller 5. The read path's DLL circuit 20 produces a delayed clock signal CLK2 which is input into the clock inputs of the data sampling registers 12, 13 via clock lines 21. A DLL circuit 19, 20 has, in particular, a delay element which delays the clock CLK which has been input in suitable fashion. This delay element may comprise, by way of example, a series of diodes which provide a defined time delay.

The SOC system 1 also has a device 22 for providing the internal clock signal CLK. In the present case, this clock generation device 22 is part of the computation device 8. The output of the clock generation device 22 produces an internal clock signal CLK which is input into respective clock inputs on the DLL circuits 19, 20 via clock lines 23. The internal clock CLK is also supplied to the DDR memory 3 via the interface 2. For this purpose, the clock signal CLK is first supplied to a device 24, said clock signal being produced at the output a clock signal CLK1, derived from this clock signal CLK, and also a clock signal CLK1' which is the inverse thereof. The clock signal CLK1 and the clock signal CLK1', which is the inverse thereof, are supplied to the interface 2 via clock lines 25, 26. To improve the consonance between the clock and the data signal, use is made here of a differential clock signal CLK1, CLK1' which, unlike a clock signal taking ground as a reference, is less susceptible to interference and which can be evaluated with higher precision.

In addition, provision may be made for the device 24 also to delay the clock signal CLK.

The DLL circuit 20 delays the clock signal CLK which has been input on the input side in suitable fashion. The DLL circuit 20 is controlled by means of a DQS signal DQS in this case. This DQS signal is supplied to the DLL circuit 20 via a control line 27. In each read cycle, in addition to the data D2 which have been read, a DQS signal is also supplied which indicates that valid data D2 have been applied to the interface 2 for reading. The clock for this DQS signal is used to calibrate the DLL circuit 20 to the clock for the DQS signal. The DLL circuit 20 thus produces a clock signal which is derived both from the internal clock signal CLK and from the DQS signal and which is supplied to the clock inputs of the data sampling registers 12, 13. The output signal CLK2 from the DLL circuit 20 is thus taken as a basis for setting a fixed sampling time in the data sampling registers 12, 13.

The design and manner of operation of a DLL circuit in general are widely known, which means that they will not be discussed in more detail. In terms of the design of a DLL circuit for use in DDR-SDRAM memory chips in which a data sampling register pair has been provided for reading data from the DDR memory, reference is made to US patent specification U.S. Pat. No. 6,043,694. This document describes a latch circuit which is used for calibrated DLL circuits in DDR-SDRAM memory chips. In terms of the general design and the manner of operation of such a DLL circuit and of the sampling register pairs used, as are shown in FIG. 1 of the present invention, for example, the full content of the document U.S. Pat. No. 6,043,694 is also incorporated into the present patent application.

In line with the invention, the SOC system 1 has at least one counter 28, 29, 30. In the exemplary embodiment in FIG. 1, it will be assumed that the counter 28 is part of the interface controller 5 and is in the form of a hardware counter. However, it would also be conceivable for the counter to be produced using software, e.g. as part of the computation device 8, as is shown in dashes in FIG. 1. In addition, it would also be conceivable for the counter 30 also to be arranged in the DDR memory 3 (shown in dashes).

The text below will give a more detailed explanation of the inventive method and of the inventive arrangement for synchronizing the DLL circuit 20 when reading data from the DDR memory 3 with reference to FIG. 1:

The DDR memory 3 sends read data D2 together with a change in the DQS signal to the memory interface 2. The read data D2 are valid during a defined period after a change in the DQS signal DQS on the data bus or the memory interface 2. The DLL circuit 20 is used to determine the sampling time. The DLL circuit 20 takes the DQS signal and the system clock CLK and generates a sampling time for the read data D2 on the memory interface 2. The sampling time firstly needs to be in sync with the system clock CLK and secondly needs to be within a defined period in which the read data D2 are stable. This defined period needs to have been chosen such that it is definitely outside of a "prohibited" period containing the setup time and the hold time. In this context, "in sync" means that the sampling time is prior to the next clock edge when the setup time is considered, or if this is not possible, is prior to the next clock edge when the setup time is considered, or if this is not possible, is after the next clock edge when the hold time is considered.

If no read access to the DDR memory 3 takes place over a relatively long period, then a situation may arise in which the DLL circuit or the sampling time for sampling the read data D2 is no longer matched to the present signal propagation time from the interface controller 5 to the DDR memory 3 and from the DDR memory 3 to the memory controller 15. As a result, in the extreme case, data may be lost in the memory controller 15 upon a subsequent read access operation.

The invention therefore performs an artificial, stimulated memory access operation. This stimulated memory access operation is used by the memory controller 15 to force a change in the DQS signal and hence to track the DLL circuit 20 or to synchronize it to the system clock again.

To determine when such a stimulated memory access operation needs to take place, it is necessary to establish when the last memory access operation took place. Hence, the maximum time since the last memory access operation took place is determined. In the present example, times are determined using the number of clock cycles in the internal clock signal. For this purpose, the hardware counter 28 counts the individual clock cycles in a clock signal CLK after the last access operation to the external DDR memory 3 which resulted in a signal change in the DQS signal.

The number of clock cycles after which a memory access operation is forced should be dependent on the frequency of the memory controller 15. In addition, this number needs to be chosen on the basis of the environment parameters' gradients which are possible in the application such that the DLL circuit 20 does not lose synchronism with the DDR memory 3.

Typically, the maximum period and hence the maximum number of clock cycles between two read access operations to the DDR memory 3 which triggers a signal change in the DQS signal is defined specifically for each system. In particular, this is dependent on the environment parameters under which the respective system is intended to operate. If this system operates in an environment with greatly fluctuating temperatures or over a very wide temperature range, then this period is increasingly reduced. Typically, in the case of systems with externally coupled DDR-SDRAM memory modules, these are designed to operate in a relatively small temperature range of between 0° C. and 70° C. However, systems which operate over a very much larger temperature range, for example of between −40° C. and 150° C., as is the case in automotive applications, for example, would also be conceivable. In these ranges, the DLL circuit would run out of the synchronism range far more quickly and would therefore need to be artificially synchronized very frequently in order to remain operational.

Once the hardware counter 28 has counted the number of clock cycles which corresponds to the maximum period, then the hardware counter 28 produces a control signal S1 which is supplied to the DLL circuit 20 via a control line 31. This control signal S1 may optionally be used to calibrate the DLL circuit 20. The output of the DLL circuit 20 produces a status signal S2 which is supplied to the device 15 via lines 32. This status signal S2 indicates the present setting of the DLL circuit 20.

In addition, a stimulated memory access operation to the DDR memory is initiated. In this case, data from the which has been read and the DQS signal are output, which thus results in a change in the DQS signal. As a result of this change in the DQS signal, the DLL circuit 20 synchronizes itself to the system clock CLK again and the sampling time is definitely outside of the prohibited period again.

The memory address from which the data is currently being read during this artificially stimulated access operation may either be firmly prescribed or adjustable or may be ascertained on the basis of a particular algorithm. By way of example, such an algorithm may provide for the last read access operation to be repeated. Provision may also be made for this read access operation to involve "dummy" data being read, which are thus not processed.

In one alternative solution, the forced memory access operation may also be initiated via the memory controller 15 or another module, for example a software driver 29 in the computation device 8. These trigger a read access operation to the DDR memory 3, for example periodically after an adjustable or firmly prescribed time, regardless of whether a regular access operation has taken place in the meantime.

In another alternative solution, provision may be made for future external memory chips to contain a circuit 30 which send one or more synchronization pulses after a fixed or adjustable number of clock cycles. These synchronization pulses may be output either periodically or after a defined, firmly prescribed number of clock cycles after which there has been no fresh read access to the memory chip.

Although the present invention has been described above with reference to a preferred exemplary embodiment, it is not limited thereto but rather may be modified in a wide variety of ways.

Thus, the invention is particularly not limited to an SOC system but rather may be extended to any systems which are coupled to an external memory chip via an interface and which have a DLL circuit. In addition, just one exemplary architecture has been indicated for the SOC system, which can be altered very easily through appropriate variation and modification, but without departing from the fundamental concept of the present invention. In addition, the invention is not limited to the use of a specific DDR-SDRAM memory, but rather can be extended to any memory chips which have a similar functionality, in particular. It goes without saying that the numerical examples indicated have been indicated merely by way of example and are not intended to limit the invention to that extent.

In the present case, the controllers in question are in the form of program controlled devices, particularly in the form of microcontrollers or microprocessors. However, the function of these elements may additionally or alternatively also be replaced by any other program controlled device or else by a hardwired device which has an appropriate program or by a programmable circuit, e.g. an FPGA or PLD circuit.

In the exemplary embodiment above, reference is always made to a DQS signal. It goes without saying that this may also be understood to mean a DQS signal change, in particular. In addition, a plurality of DQS signals, for example four, may also be provided instead of one DQS signal.

In the exemplary embodiment above, the invention has been presented on the basis of read access, but it goes without saying that it may also be used for write access, in addition or alternatively.

LIST OF REFERENCE SYMBOLS

1 SOC system
2 (Memory) interface
3 Memory chip, DDR-SDRAM memory
4 External address data bus
5 Interface controller
6 Address lines
7 Data lines
8 Computation devices, program controlled device
9 Data/control lines
10 Data lines
11 Register device
12,13 Data sampling register
14 Data lines
15 Device for data preprocessing, memory controller
16 Data lines
17 Write path
18 Read path
19 (Write path's) DLL circuit
20 (Read path's) DLL circuit
21 Clock lines
22 Clock generation device
23 Clock lines
24 Device for inverting a clock signal
25,26 Clock lines
27 Control lines
28 (Hardware) counter
29 (Software) counter
30 Counter in the memory
31 Control line
32 Connecting line
D1 (Written) data
A1 Address signals
D2,D2',D" (Read data)
CLK,CLK2 Clock signals
CLK1,CLK1' Clock signals
S1, S2 Control signals
DQS DQS signal

What is claimed is:

1. Memory arrangement for processing data, having:
   (a) an external memory, for writing and reading data,
   (b) an interface which is coupled to the memory and, during an access operation, has data together with a control signal indicating that valid data are being applied to the interface,
   (c) a register device whose data input is connected to the interface for the purpose of inputting the data applied thereto and which has a clock input for inputting a delayed clock signal,
   (d) a DLL circuit which has a control input for inputting the control signal, with a change in the control signal activating the DLL circuit, and which has a clock output for providing delayed clock signal which stipulates the sampling time in the register device and which synchronizes the register device, and
   (e) a device which effects forced access to the memory after a predetermined length of time within which there has been no access to the memory.

2. Memory arrangement according to claim 1, wherein the device has a counter, particularly a hardware counter or a software counter.

3. Memory arrangement according to claim 1, wherein an interface circuit is provided which has a control device, the interface and also a bus which can be operated bidirectionally, where the control device and the bus can be used to write write data to memory and to read read data from the memory, the control device being designed to control the writing and/or reading in the memory.

4. Memory arrangement according to claim 3, wherein the counter is part of the interface circuit, particularly of the control device.

5. Memory arrangement according to claim 2, wherein the counter is part of the external memory.

6. Memory arrangement according to claim 2, wherein the functionality of the counter is implemented in a program controlled device in an evaluation device.

7. Memory arrangement according to claim 1, wherein a clock generation device is provided for the purpose of providing an internal clock signal for the DLL circuit.

8. Memory arrangement according to claim 1, wherein the register device has two data sampling registers which are arranged in parallel with one another, are operated at a double sampling frequency and to which the data which have been read are alternately written.

9. Memory arrangement according to claim 1, wherein an evaluation device is provided for the purpose of evaluating the data which have been read, said evaluation device having a program controlled device, particularly a microprocessor or microcontroller.

10. Memory arrangement according to claim 1, wherein the memory is in the form of a DDR memory, particularly in the form of a DDR-SRAM memory.

11. Memory arrangement according to claim 1, wherein the memory arrangement has an SOC system.

12. Memory arrangement according to claim 1, wherein the access operation is a read access operation in which read data are read from the memory.

13. Method for reading data from and/or for writing data to a memory, particularly in a memory arrangement according to claims claim 1, in which a control signal is also transferred together with the data, in which a change in the control signal activates the DLL circuit and synchronizes it to a clock, in which the DLL circuit stipulates a sampling time for the data, and in which, after a predetermined length of time within which no data have been read from the memory, the memory is accessed artificially in order to generate a change in the control signal for the DLL circuit.

14. Method according to claim 13, wherein the predetermined length of time is determined from the number of clock cycles in an internal clock signal.

15. Method according to claim 13, wherein the predetermined length of time is firmly prescribed.

16. Method according to claim 13, wherein the predetermined length of time is adjustable.

17. Method according to claim 13, wherein the artificial access to the memory involves the data which have been read last being read again or the data which have been written last being written again.

18. Method according to claim 13, wherein the artificial access effects a change in the control signal which is input into the DLL circuit in order to activate it, and the change in the control signal resynchronizes the sampling time to an internal clock.

19. Method according to claim 13, wherein the control signal is the DQS signal, particularly a change in the DQS signal.

20. Method according to claim 13, wherein the access operation is a read access operation in which read data are read from the memory.

* * * * *